United States Patent
Schadewald, Jr. et al.

(10) Patent No.: US 6,604,948 B1
(45) Date of Patent: Aug. 12, 2003

(54) DOUBLE-DOUBLE (2×2) TESTER PADDLE BOARD AKA 2×2 PADDLE BOARD

(75) Inventors: Frank W. Schadewald, Jr., Bloomington, MN (US); Mark J. Schaenzer, Eagan, MN (US); Zuxuan Lin, Shakopee, MN (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/589,607

(22) Filed: Jun. 7, 2000

Related U.S. Application Data
(60) Provisional application No. 60/138,213, filed on Jun. 9, 1999.

(51) Int. Cl.[7] .................................................. H01R 9/09
(52) U.S. Cl. ............................................ 439/55; 361/749
(58) Field of Search ............................. 439/55, 67, 77, 439/76.1; 174/250, 255, 254; 361/749–751, 789, 748

(56) References Cited

U.S. PATENT DOCUMENTS

| | | |
|---|---|---|
| 4,604,665 A | 8/1986 | Muller et al. |
| 4,633,110 A | 12/1986 | Genco et al. |
| 4,673,834 A | 6/1987 | Wrobel |
| 5,322,974 A * | 6/1994 | Walston ................ 174/250 |
| 5,548,458 A | 8/1996 | Pelstring et al. |
| 5,635,781 A | 6/1997 | Moritan |
| 5,672,927 A | 9/1997 | Viskochil |
| 5,705,868 A | 1/1998 | Cox et al. |
| 5,770,900 A | 6/1998 | Sato et al. |
| 5,876,216 A | 3/1999 | Schadewald, Jr. et al. |
| 6,038,102 A * | 3/2000 | Balakrishnan et al. ...... 360/104 |

* cited by examiner

*Primary Examiner*—P. Austin Bradley
*Assistant Examiner*—Phuongchi Nguyen

(57) ABSTRACT

A connector board which interfaces a disk drive head assembly to a test apparatus. The connector board is capable of being separated into segments which facilitate head assembly testing without changing connector boards, wherein test connections may be established supporting differing numbers of head assembly wires. By way of example, the connector board is adapted so that it may be used with either four-wire heads or two-wire heads, and further provides simplified separation should only a two-wire connection be required.

19 Claims, 8 Drawing Sheets

DOUBLE-DOUBLE (2×2) TESTER PADDLE BOARD AKA 2×2 PADDLE BOARD

CROSS-REFERENCE TO RELATED APPLICATIONS

This application claims priority from U.S. provisional application serial No. 60/138,213 filed on Jun. 9, 1999, which is incorporated herein by reference.

STATEMENT REGARDING FEDERALLY SPONSORED RESEARCH OR DEVELOPMENT

Not applicable

REFERENCE TO A MICROFICHE APPENDIX

Not applicable

BACKGROUND OF THE INVENTION

1. Field of the Invention

The present invention pertains generally to testing head assemblies in disk drive mass storage systems, and more particularly to a connector board for providing electrical connections between a disk drive head assembly and a testing apparatus during testing and media certification.

2. Description of the Background Art

Disk drives are used extensively for storing digital data as a series of magnetic domains upon one or more platters, or disks, which are fabricated from a magnetizable material. The disks are configured to rotate about a spindle wherein data is read and written from the disk surface by a head assembly. The head assembly is positioned in close proximity to the disk surface where it can read or write a circular track on the disk platter. The head assembly is mounted to an actuator assembly capable of moving the head to any track on the planar surface of the platter. An actuator assembly includes an actuator and an actuator block for supporting the heads. Heads are coupled to the actuator block via a head gimbal assembly (HGA) and a load beam. The gimbal assembly allows the head to pitch and roll according to the topology of the disk surface. A slider is associated with the head which is capable of flying over the boundary layer of air associated with a moving disk platter.

To reduce the failure rate of an assembled disk drive in the field, a large portion of the assemblies in the disk drive are tested separately. In particular, drive heads, which are major components of disk drives, are tested individually using a head tester. Disk drive heads typically comprise miniature transducer elements having an integral set of very fine gauge wires to accommodate movement of the head when attached to an electromechanical actuator assembly. The head tester measures the electrical characteristics of the head and preferably the flying parameters relating to the head and its slider. In addition, the disk drive media is tested in a certification process which is preferably performed in combination with the head assembly that is to be used with the media in the final drive assembly. After media certification, the head assemblies are packaged and assembled with the media into a disk drive.

During testing, the head assembly may be interfaced to various test equipment which may provide different forms of test connections. Prior to testing, the fine-wire leads of the head assembly are conductively attached to a connector board to facilitate providing serviceable test connections. Since the method of establishing electrical connection with the tester often varies, the fine-wires from the head assemblies may need to be removed from one connector board, after the completion of a particular test or tests, and reattached to another connector board for subsequent testing. Each time the connector board is changed, the wires from the head assembly which are bonded to the connector board must be disconnected and subsequently bonded to another connector board. It will be appreciated, therefore, that changing from one such connector board to another is not only time consuming, but it introduces another step into the process that can lead to head damage from mechanical stresses or static voltage stresses. For example, the current class of GMR heads can be sensitive to any electrostatic discharge (ESD) event which exceeds five volts. As the disk drive industry has moved increasingly towards the use of magnetoresistive (MR) heads within disk drives, the heads typically require a total of four contacts, two for the write element and two for the read element. A substantial percentage of the connector boards being used therefore are configured as four-wire connector boards.

An example of a four-wire connector board can be found in our prior U.S. Pat. No. 5,876,216 entitled "Integrated Connector Board for Disc Drive Storage Systems" issued on Mar. 2, 1999, which is incorporated herein by reference. That patent describes a connector board that has a four-wire "input" connector for attachment to a head assembly and two-sets of four-wire "output" connectors having different pinout configurations for interfacing with different types of test apparatus. Such "double-connector" boards can be fabricated to accommodate head assemblies which require any number of connections, such as two-wire, four-wire, and five wire. As can be seen in FIG. 1, one aspect of the above-referenced double-connector board is an integrated right and left side, conductor pads that are arranged in a predefined pattern for the pin contactor of a head tester block, and conductor traces adapted for insertion within an insertion connector terminal of a media tester. It should be noted that FIG. 1 illustrates the flexibility of the double-connector board wherein heads are shown joined by wiring to each of the left and right side portions; however in practice, a head would be joined to either portion, but not both portions. The double-connector board therefore provides a reliable method of establishing connectivity with a tester configured for that particular number of head wires and phase of head assembly testing.

While the foregoing double-connector board configuration is suitable for most four-wire MR heads, some disk drive manufacturers utilize both two-wire connector boards and four-wire connector boards. In addition, two-wire connector boards are still utilized by a number of companies, in which case a separate connector board is required for the read and write heads. Furthermore, combination heads are being used in which read and write access is provided by means of a single pair of connections. As a result, connector boards are still being swapped out, even though damage to the head may occur, because making a changeover would be costly and difficult due to the large installed base of testers having the present configurations.

Therefore, a need exists for a connector board that provides test connectivity during head testing and media certification to testers configured for either four-wires or two-wires. The present invention satisfies those needs, as well as others, and overcomes the deficiencies of previously developed connector board solutions.

BRIEF SUMMARY OF THE INVENTION

The present invention is a connector board which provides head assembly connectivity for testers employing various aggregate numbers of connections. The connector board of the present invention may be utilized with testers requiring either a four-wire connection or a two-wire connection. By way of example, and not of limitation, the invention comprises an integrated pair of double-connector boards that may be separated into two separate four-wire double-connector boards (e.g., a right side, and a left side that is a mirror image of the right side) as described in our previous patent, U.S. Pat. No. 5,876,216 which is incorporated herein by reference, and which may also be further divided into two separate two-wire connector boards (e.g., an upper two wire board and a lower two-wire board).

An object of the invention is to provide a connector board which is compatible with two-wire and four-wire testing of head assemblies.

Another object of the invention is to provide a four-wire connector board that can be further separated into a pair of two-wire connector boards.

Another object of the invention is to provide multiple electrical connection formats within the same connector board, such as edge connectors and pin type connections, which may be employed at different stages of the head assembly testing process.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only, and where like reference numbers denote like parts.

DETAILED DESCRIPTION OF THE INVENTION

Referring more specifically to the drawings, for illustrative purposes the present invention is embodied in the apparatus generally shown in FIG. 2 through FIG. 6. It will be appreciated that the apparatus may vary as to configuration and as to details of the parts, and that the method may vary as to the specific steps and sequence, without departing from the basic concepts as disclosed herein.

Figure 1:
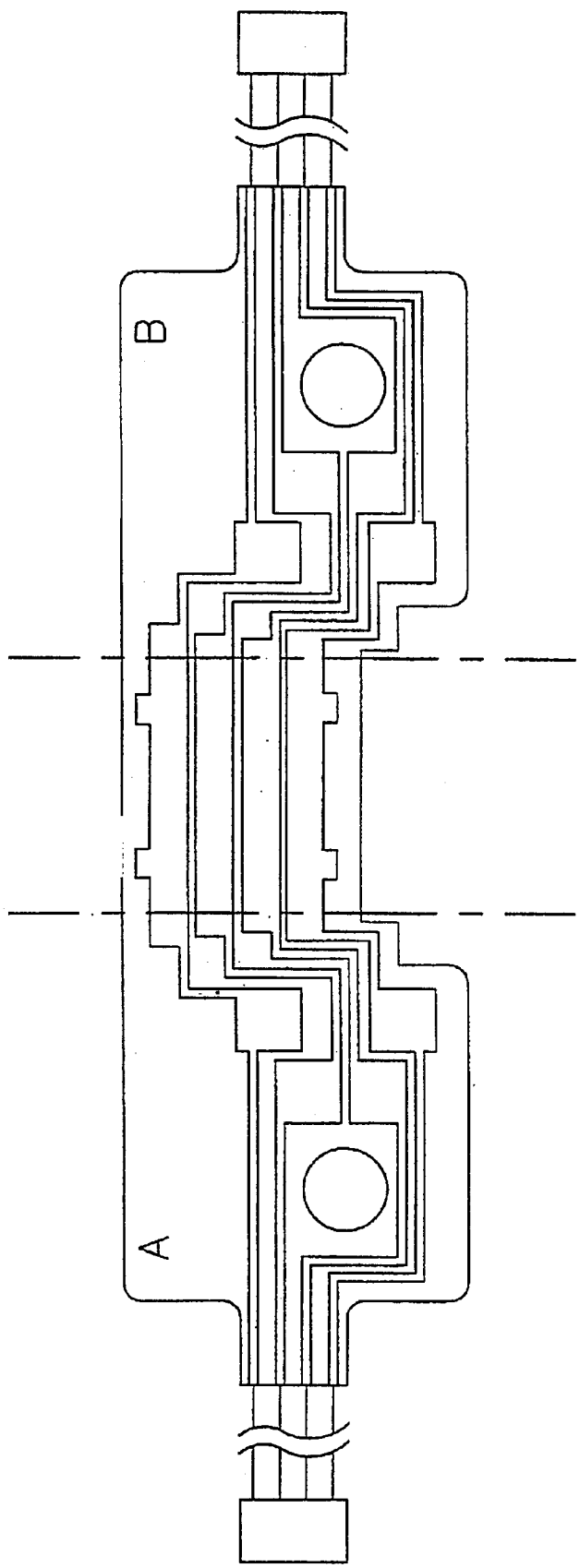
FIG. 1 is a plan view of a prior art integrated double-connector board without our improvement.
Figure 2:
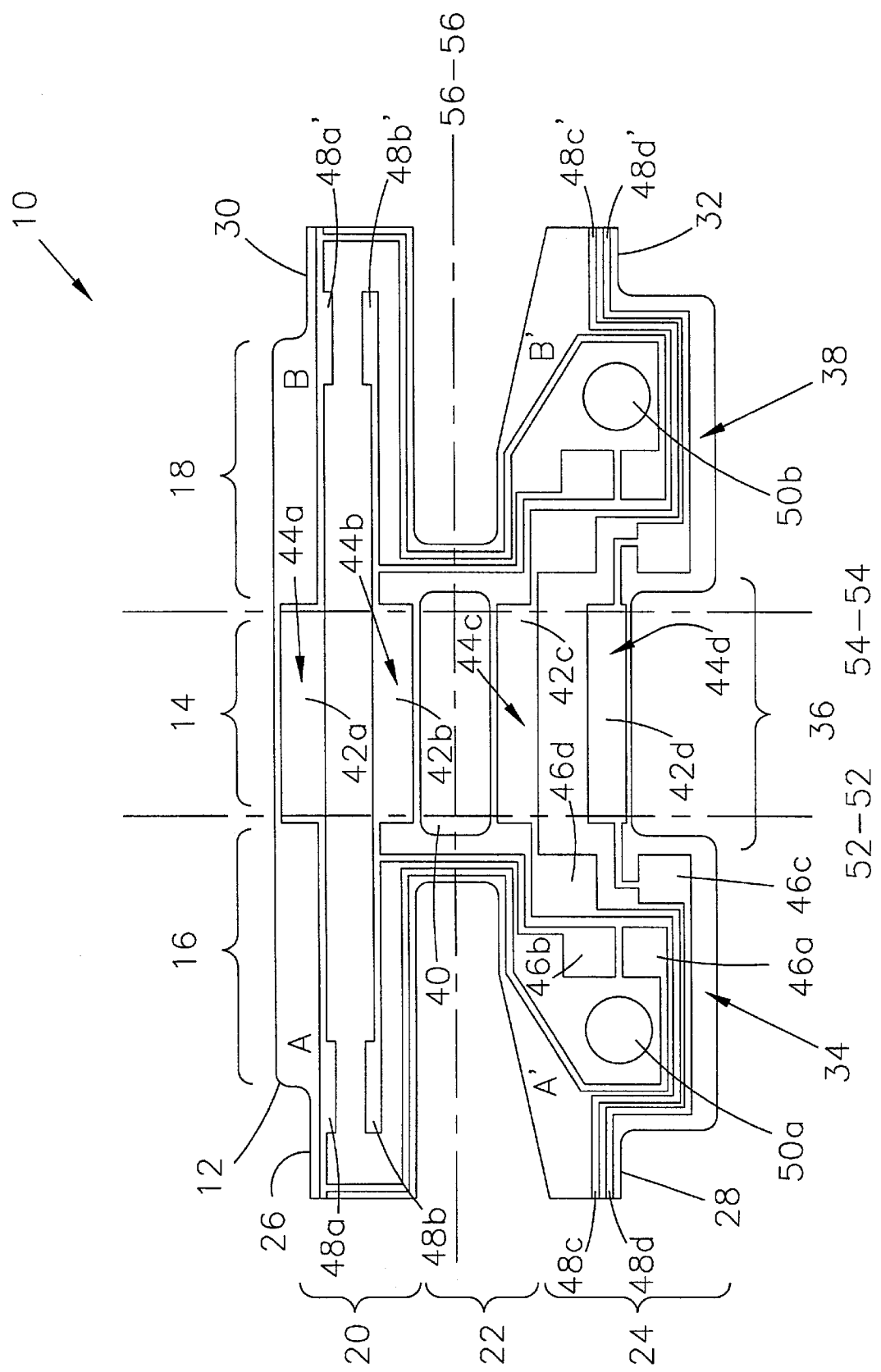
FIG. 2 is a plan view of an integrated double-double connector board according to the present invention.

FIG. 2 shows the preferred embodiment of an integrated two-wire/four-wire (double-double) connector board 10, also referred to as "paddle-boards", according to the invention. As can be seen, connector board 10 comprises a board member 12 which includes a center portion 14, a left-side portion 16, a right-side portion 18, an upper segment 20, a segmentation area 22, and a lower segment 24.

Note that the left 16 and right 18 side portions of the connector board are mirror images of each other, and the pair of double-connector boards are contiguous in the center portion 14. The pair of double-connector boards may be separated on either side of center portion 14 to yield either a single right-side double-connector board, or a single left-side double-connector board. The center portion is preferably kept attached to the side of the connector board upon which the heads are to be connected, while the unnecessary side is cut away. In this way, the center portion will also provide conductors adapted for insertion type connectors in a test apparatus as will be described further below.

Note also that the upper 20 and lower 24 segments can be separated along a longitudinal axis between the ends of the connector board to yield a pair of two-wire connector boards. Separation can take place either before or after separation into a left or a right side portion as described above.

Preferably the left-side portion 16 is configured as a four-wire double-connector board (A+A'), or optionally may be divided to provide a two-wire connector board (A or A'). The right-side portion 18 is similarly configured for segmentation, and by way of example and not of limitation, mirrors the left-side portion 16 as a four-wire double-connector board as (B+B') that can also be divided to provide a two-wire connector board (B or B'). Tab extension 26 protrudes from upper segment 20 of the left-side portion 16, and similarly, tab extension 28 protrudes from the lower segment 24 of left-side portion 16. The right-side includes similar tab extensions 30 and 32.

Within the lower segment 24, a test apparatus contact pad area 34 is contained within an enlarged area. A notched area 36 is located centrally and preferably configured to accommodate the channel of the testing block (not shown). A similar test apparatus contact pad area 38 is disposed on the right-side portion 18. The enlarged contact pad area preferably provides pads by which pin contact connectors may establish connection with the double-connector board, such as while it is mounted to a head testing block (not shown) as described in our prior U.S. Pat. No. 5,876,216. An interior cutout 40, further separates the upper segment 20 and lower segment 24 within the center portion 14 to reduce the lateral material of the board and to facilitate separation of the upper and lower segments.

The center portion 14 includes insertion conductors 42a–42d on a plurality of circuit paths 44a–44d. Referring to left-side 16, along the circuit paths are contact pads 46a–46d on the lower segment 24 configured to provide connective test access by means of pin type connectors, as well as leads 48a–48d upon which head wires may be bonded. Holes 50a, 50b are provided for alignment to the test block during testing and certification. After head testing is performed on the test block, the unused portion of the connector board is preferably removed by severing the material along either line 52—52, if the head is attached to the right-side double-connector board, or along line 54—54, if the head is attached to the left-side double-connector board. The insertion connectors 42a–42d of either connector board are thereby made accessible for an insertion style connector, or edge connector, as would typically be utilized within a media certification tester.

The pair of double-connector boards 10 are preferably fabricated, by way of example and not of limitation, using conventional printed circuit board techniques. An example of such conventional construction is the creation of a three ply FR-4 material laminate structure, or a polyimide material structure, or an epoxy resin-bonded cellulose board having metallic conductive traces on one or both exterior surfaces.

Utilizing a two-wire/four-wire double-connector board according to the present invention during the head testing process can eliminate the need to remove the head wires from one connector board during the testing process and the subsequent attachment to another connector board for a subsequent test process. A specific test process is exemplified by the following description. After one head assembly is mounted to a side of the double-double-connector board, the connector board is attached via the mounting holes to a tester block. Electrical access to the head assembly is then provided by pin type connection contacts which are typically spring-loaded, and that interface with the pad regions toward the center portion of the connector board. It will be appreciated that either a four-wire head assembly or a two-wire head assembly may be utilized. Testing of the head assembly proceeds until the electrical, and typically the fly parameters as well, have been characterized.

Afterward, the heads are typically tested on a media tester, wherein the media is certified using the prospective actual head assembly that will be used with the media in the final assembly. Media testing with the actual head to be packaged with the assembled drive is preferred as the process assures the compatibility between head and disk. Prior to testing on a media tester, the unneeded portion of the double-connector board is removed such that the center portion remains contiguous with the side of the double-connector board upon which the head wires are joined.

Figure 3A:
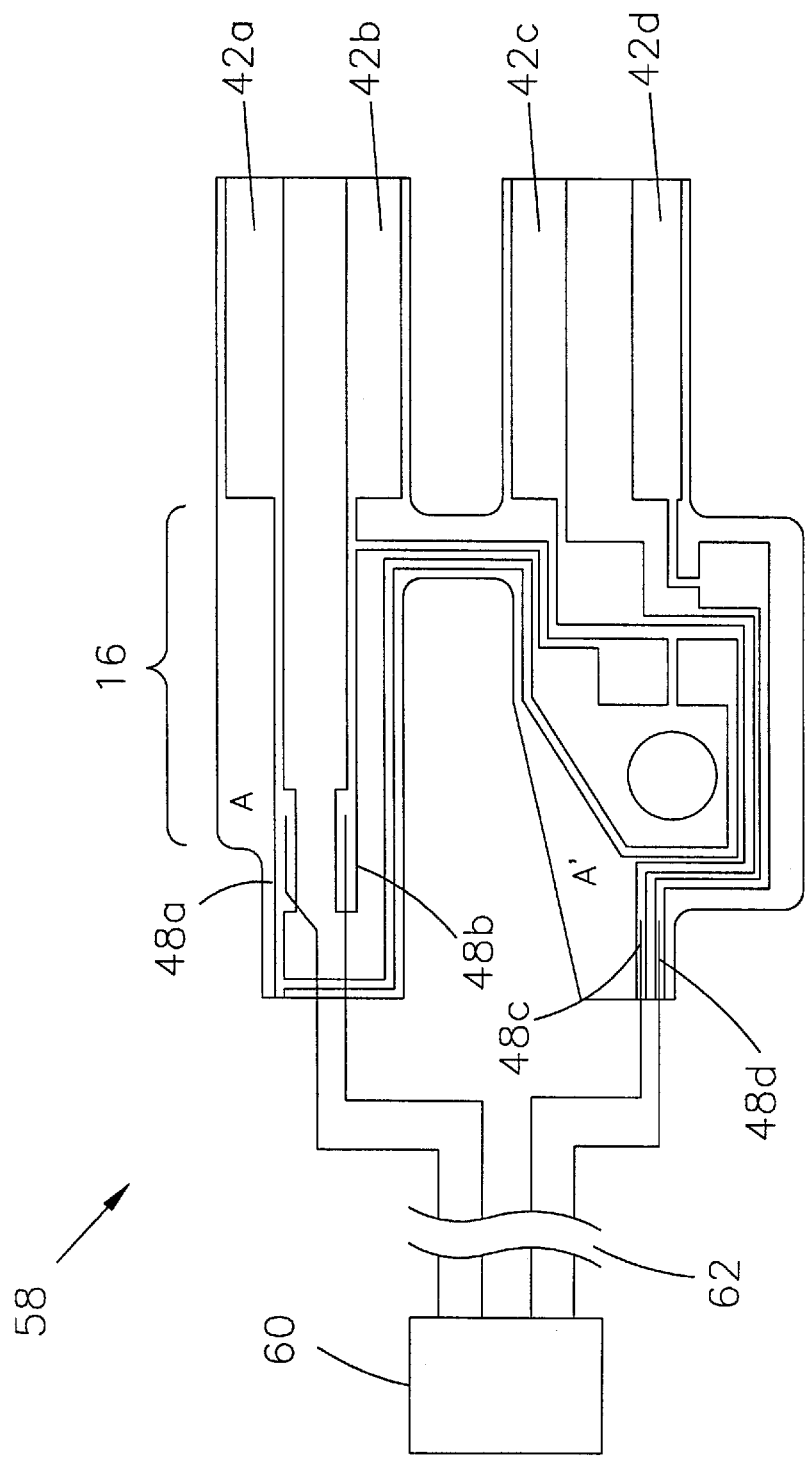
FIG. 3A is a plan view of the left side of the connector board of FIG. 2, shown separated for use from the integrated pair and schematically shown wired to a four-wire head assembly.
Figure 3B:
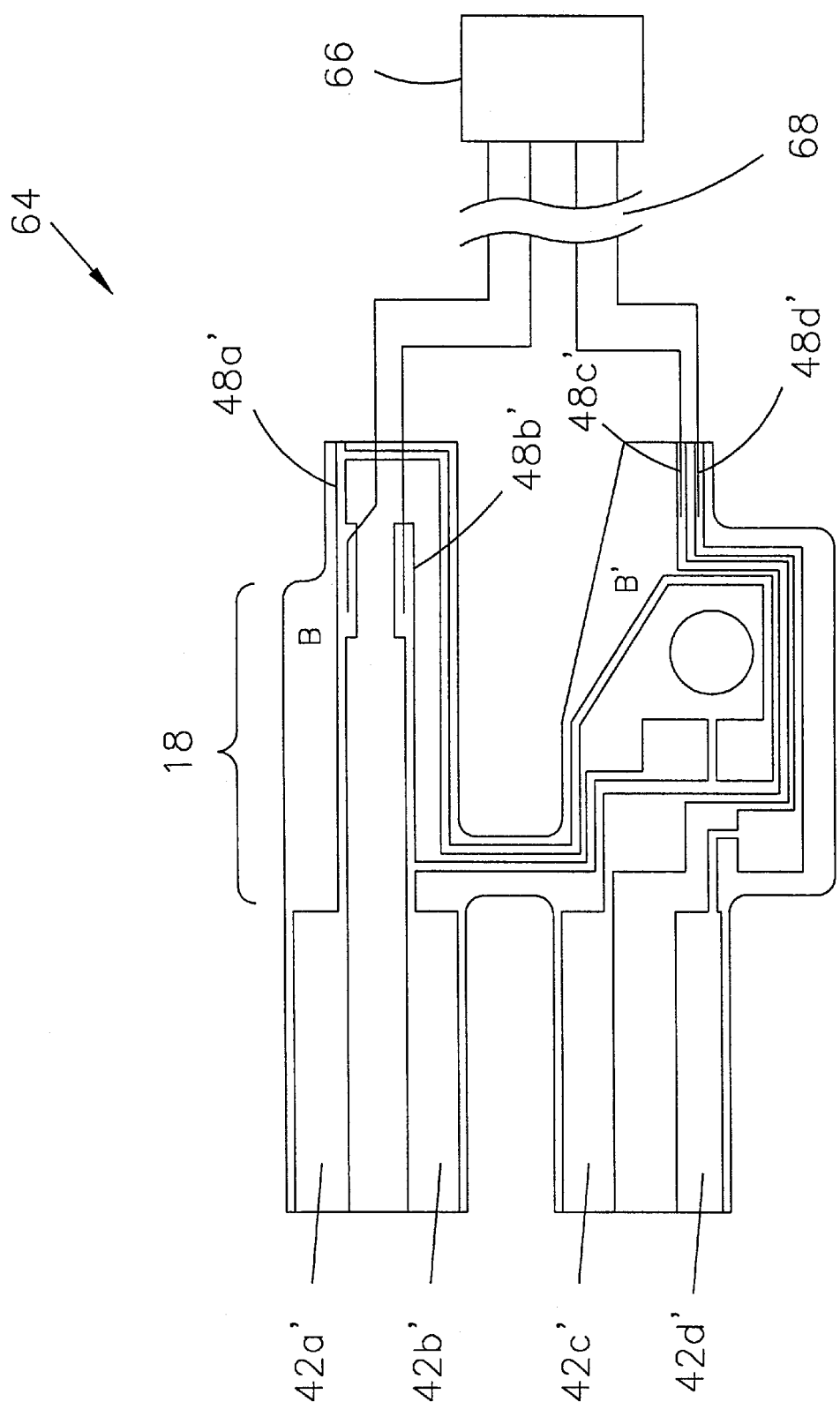
FIG. 3B is a plan view of the right side of the connector board of FIG. 2, shown separated for use from the integrated pair and schematically shown wired to a four-wire head assembly.

Referring to FIG. 3A, after the unneeded portion of the double-connector board has been severed and removed, a double-connector board 58 remains. Insertion connectors 42a–42d are then accessible for insertion into the pre-amp connector of the media tester (not shown). The media tester thereby gains electrical access to the head assembly 60 which is connected by wires 62 to the trace leads 48a–48d of the double connector board. Alternative use of the right-side portion of the double-connector board 64 is illustrated in FIG. 3B, wherein a head assembly 66 is joined by wires 68 to the connector board at leads 48a'–48d'. It will be appreciated that the insertion connector fingers 42a'–42d' in this configuration are now ready for insertion within the media tester. The connection of wires 62 to the leads 48a–48d, or alternatively the wires 68 to the leads 48a'–48d', of either connector board may be carried out by any conventional bonding method, such as by eutectic soldering.

In general, the above described test process could be performed with the conventional four-wire double-connector board as previously described which makes no alternative provision for two-wire testing. However, encountering any of a number of situations in which the head assembly is tested on a system configured for two-wire testing would require that the head assembly be disconnected from the four-wire connector board during the testing process and reattached to a two-wire connector board so that testing could be completed.

Figure 4:
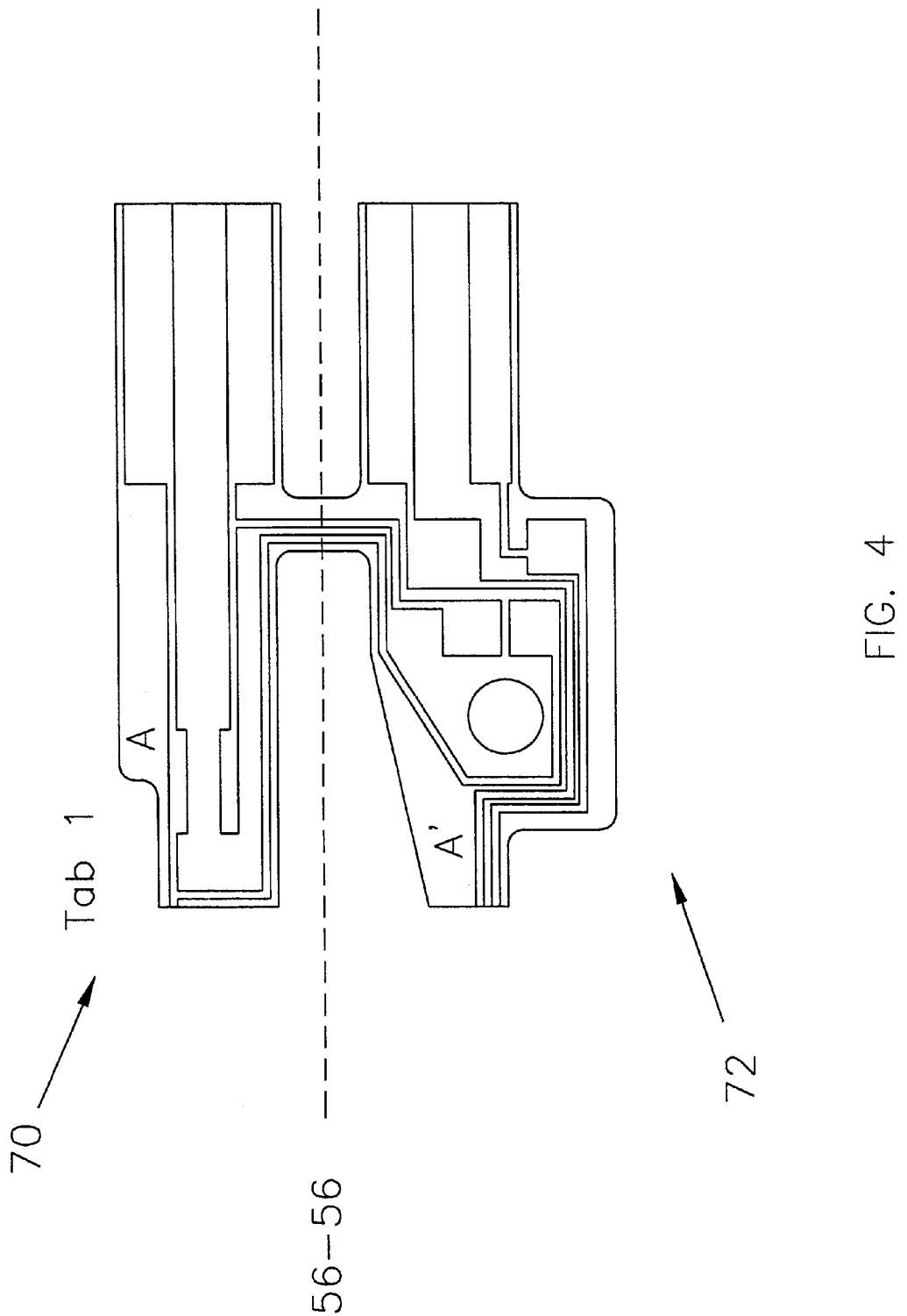
FIG. 4 is a plan view of the left side of the connector board of FIG. 2 shown after being severed along the longitudinal axis into a pair of segments defining separate two-wire connector boards.

Referring now to FIG. 4 and still referring to left side 16 by way of example, the connector board can be severed along the longitudinal axis between the ends of the connector boar represented by line 56—56 into an upper two-wire connector board 70 and a lower two-wire connector board 72. It will be appreciated that the upper connector board could no longer be properly referred to as a "double-connector board" since the alternative pin contact pads are no longer available, or necessary, in the exemplified embodiment. For the sake of clarity in FIG. 4 a connector board is depicted without an attached head, although it should be noted that one or more head assemblies would be joined to one side of the connector board prior to media testing. Examples of situations wherein use of the two-wire connector boards confer a significant advantage include: the use of separate read and write heads joined to each of the two-wire portions of the connector board, and the use of combination heads having both read and write heads combined into a single two-wire head assembly (such as PZT and thermal asperity heads).

Figure 5A:
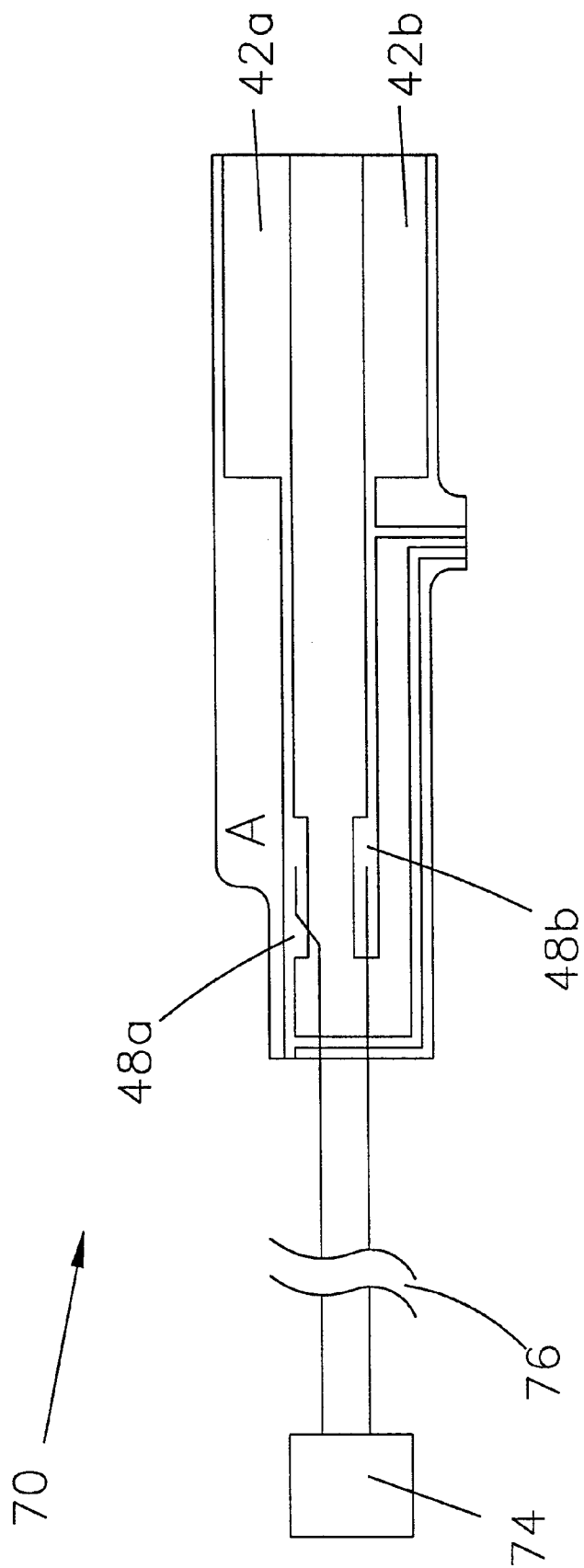
FIG. 5A is a plan view of the upper portion of the connector board of FIG. 4 schematically shown wired to a two-wire head assembly.
Figure 5B:
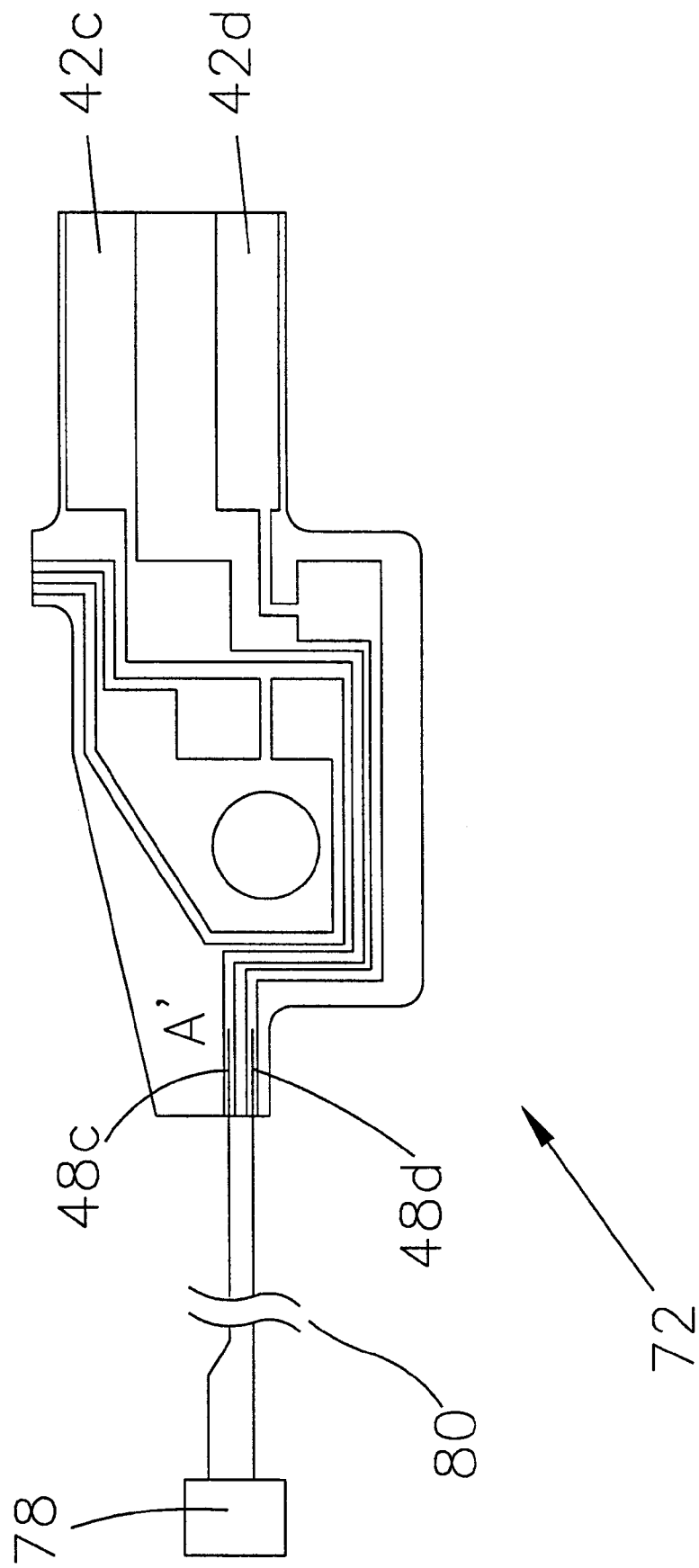
FIG. 5B is a plan view of the lower portion of the connector board of FIG. 4 schematically shown wired to a two-wire head assembly.

FIG. 5A shows a head 74 joined by wiring 76 to a two-wire connector board 70 which, prior to bifurcation, formed the upper portion of the four-wire connector board 58 of FIG. 3A. Conductors 42a, 42b form an edge connector of a width suitable for insertion within a two-wire insertion type connector which may be provided by a two-wire media tester. It will be appreciated that prior to separation of the upper and lower sections, the combined conductors provided four fingers suitably configured for insertion within a four-wire insertion type connector, such as may be found in a four-wire media tester. FIG. 5B similarly illustrates a head 78 joined by wiring 80 to the two-wire connector board 72 which was previously positioned as the lower portion of the four-wire connector board 58. The insertion conductors 42c, 42d again provide a two-wire connection that may be inserted within a two-wire insertion type connector, such as may be found on a media tester.

Figure 6:
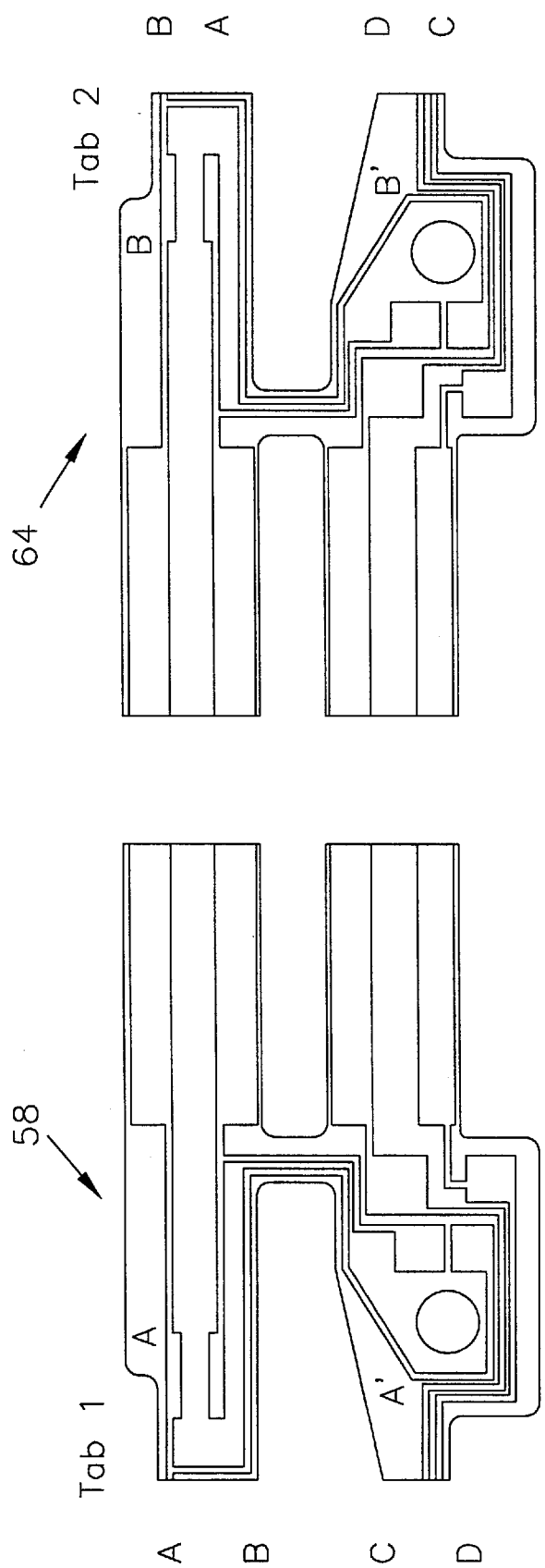
FIG. 6 is a plan view of the connector board of FIG. 2 separated into two sides which are mirror images of each other, and showing alphabetic tab wiring positions.

Although FIG. 5A and FIG. 5B illustrate the use of separate two-wire head assemblies, it will be recognized that the wiring from an integrated four-wire head assembly could be joined to each of the separated two-wire connector boards to facilitate connection to a tester offering only separate two-wire connectors. FIG. 6 is a sample wiring diagram for the four-wire double-connector boards 58, 64. The wire colors and functions corresponding to the contacts lettered A–D are set forth in Table 1.

Accordingly, it will be seen that this invention provides a connector board that is compatible with a variety of multi-wire heads and their associated testers. Furthermore the use of the connector board according to the invention can simplify the disk drive manufacturing process steps wherein the heads are tested and the media certified. Although an aspect of the invention was described above for use as a two-wire/four-wire double-connector board, it will be recognized that the invention may be practiced with different wiring splits (i.e. five wire head whose wiring is split into a two-wire and three wire connector) in accordance with the connectors being matched.

Electrical connection between the connector board and an electrical connector, such as of a media tester, is provided by electrical contact connectors within the described embodiment. It will be recognized that although other forms of connectors may not be equivalent, in many instances they can be utilized for establishing connection between the connector board and a tester. Furthermore, it should be recognized that the method is generally applicable to various types of read and write heads, including magnetic heads, and should be applicable to newer applications such as laser heads employed for use with optical media.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Connections to Double-connector Board, Wire Color and Function

| Connection | Tab 01 (up) | Tab 02 (down) |
|---|---|---|
| A | Gold/Writer (−) | Green/Reader (MR−) |
| B | Blue/Writer (+) | Red/Reader (MR+) |
| C | Green/Reader (MR−) | Gold/Writer (−) |
| D | Red/Reader (MR+) | Blue/Writer (+) |

What is claimed is:

1. In a connector board for interfacing a disk drive head with a test apparatus, said connector board having a first end, second end, right portion and left portion, the improvement comprising;
   (a) at least two spaced apart electrical conductors adapted for connection to a disk head and connected to
      (i) at least two corresponding spaced-apart insertion connectors adapted for connection to an insertion type connector and
      (ii) at least two corresponding conductor pads adapted for connection to a pin type connector; and
   (b) the connector board having a cutout, said cutout defining physical segments in said connector board and facilitating separation of said connector board, along at least one of a longitudinal axis between said ends and a center axis extending between said right and left portions of said connector board and perpendicular to the longitudinal axis, into at least two physically and electrically isolated connector board segments, at least one said segment for connecting a read element of said disk head to said test apparatus and at least one said segment for connecting a write element of said disk head to said test apparatus.

2. A connector board as recited in claim 1:
   (a) wherein said connector board segments comprise a first segment and a second segment;
   (b) wherein said first segment includes a said one of said electrical conductors adapted for connection to said disk head and connected to a corresponding spaced-apart electrical conductor adapted for connection to an insertion type connector;
   (c) wherein said second segment includes a said one of said electrical conductors adapted for connection to said disk head and connected to a corresponding spaced-apart electrical conductor adapted for connection to an insertion type connector; and
   (d) wherein said second segment includes said electrical conductors adapted for connection to a pin type connector.

3. A connector board as recited in claim 1, wherein said board member is a material selected from a group consisting of laminate, polyimide or epoxy resin-bonded cellulose.

4. A connector board as recited in claim 1, wherein said board member further comprises a section having a plurality of portions defining a hole.

5. In a connector board for interfacing a disk drive head with a test apparatus, said connector board having first and second ends, the improvement comprising;
   (a) first and second side portions extending from a central portion of said connector board toward said first and second ends, wherein each said side portion includes at least two spaced-apart electrical conductors adapted for connection to a disk head and electrically connected to
      (i) at least two corresponding spaced-apart insertion connectors adapted for connection to an insertion type connector and
      (ii) at least two corresponding conductor pads adapted for connection to a pin type connector; and
   (b) the connector board having a cutout, said cutout defining physical segments in said connector board and facilitating separation of said connector board along, at least one of a longitudinal axis between said ends and a center axis extending between said first and second side portions of said connector board and perpendicular to the longitudinal axis, into at least two physically and electrically isolated connector board segments, at least one said segment for connecting a read element of said disk head to said test apparatus and at least one said segment for connecting a write element of said disk head to said test apparatus.

6. A connector board as recited in claim 5:
   (a) wherein said connector board segments comprise a first segment and a second segment;
   (b) wherein said first segment includes a said one of said electrical conductors adapted for connection to said disk head and connected to a corresponding spaced-apart electrical conductor adapted for connection to an insertion type connector;
   (c) wherein said second segment includes a said one of said electrical conductors adapted for connection to said disk head and connected to a corresponding spaced-apart electrical conductor adapted for connection to an insertion type connector; and
   (d) wherein said second segment includes said electrical conductors adapted for connection to a pin type connector.

7. A connector board as recited in claim 5, wherein said board member is a material selected from a group consisting of laminate, polyimide or epoxy resin-bonded cellulose.

8. A connector board as recited in claim 5, wherein said board member further comprises a section having a plurality of portions defining a hole.

9. In a connector board for interfacing a disk drive head with a test apparatus, comprising:
   (a) a board member having first end, second end, right portion and left portion;
   (b) at least two spaced apart electrical conductors adapted for connection to a disk head and connected to
      (i) at least two corresponding spaced-apart insertion connectors adapted for connection to an insertion type connector and
      (ii) at least two corresponding conductor pads adapted for connection to a pin type connector; and
   (c) the connector board having a cutout, said cutout defining physical segments in said connector board and facilitating separation of said connector board, along at least one of a longitudinal axis between said ends and a center axis extending between said right and left portions of said connector board and perpendicular to the longitudinal axis, into at least two physically and electrically isolated connector board segments, at least one said segment for connecting a read element of said disk head to said test apparatus and at least one said segment for connecting a write element of said disk head to said test apparatus.

10. A connector board as recited in claim 9:
   (a) wherein said connector board segments comprise a first segment and a second segment;
   (b) wherein said first segment includes a said one of said electrical conductors adapted for connection to said disk head and connected to a corresponding spaced-apart electrical conductor adapted for connection to an insertion type connector;
   (c) wherein said second segment includes a said one of said electrical conductors adapted for connection to said disk head and connected to a corresponding spaced-apart electrical conductor adapted for connection to an insertion type connector; and
   (d) wherein said second segment includes said electrical conductors adapted for connection to a pin type connector.

11. A connector board as recited in claim 9, wherein said board member is a material selected from a group consisting of laminate, polyimide or epoxy resin-bonded cellulose.

12. A connector board as recited in claim 9, wherein said board member further comprises a section having a plurality of portions defining a hole.

13. In a connector board for interfacing a disk drive head with a test apparatus, comprising:
   (a) a board member having first and second ends;
   (b) first and second side portions extending from a central portion of said connector board toward said first and second ends, wherein each said side portion includes at least two spaced-apart electrical conductors adapted for connection to a disk head and electrically connected to
      (i) at least two corresponding spaced-apart insertion connectors adapted for connection to an insertion type connector and
      (ii) at least two corresponding conductor pads adapted for connection to a pin type connector; and
   (c) the connector board having a cutout, said cutout defining physical segments in said connector board and facilitating separation of said connector board, along at least one of a longitudinal axis between said ends and a center axis extending between said first and second side portions of said connector board and perpendicular to the longitudinal axis, into at least two physically and electrically isolated connector board segments, at least one said segment for connecting a read element of said disk head to said test apparatus and at least one said segment for connecting a write element of said disk head to said test apparatus.

14. A connector board as recited in claim 13:
   (a) wherein said connector board segments comprise a first segment and a second segment;
   (b) wherein said first segment includes a said one of said electrical conductors adapted for connection to said disk head and connected to a corresponding spaced-apart electrical conductor adapted for connection to an insertion type connector;
   (c) wherein said second segment includes a said one of said electrical conductors adapted for connection to said disk head and connected to a corresponding spaced-apart electrical conductor adapted for connection to an insertion type connector; and
   (d) wherein said second segment includes said electrical conductors adapted for connection to a pin type connector.

15. A connector board as recited in claim 13, wherein said board member is a material selected from a group consisting of laminate, polyimide or epoxy resin-bonded cellulose.

16. A connector board as recited in claim 13, wherein said board member further comprises a section having a plurality of portions defining a hole.

17. In a connector board for interfacing a disk drive head with a test apparatus, comprising:
   (a) a board member having first and second ends;
   (b) first and second side portions extending from a central portion of said connector board toward said first and section ends, wherein each said side portion includes at least two spaced-apart electrical conductors adapted for connection to a disk head and electrically connected to
      (i) at least two corresponding spaced-apart insertion connectors adapted for connection to an insertion type connector and
      (ii) at least two corresponding conductor pads adapted for connection to a pin type connector; and
   (c) the connector board having a cutout, said cutout defining physical segments in said connector board and facilitating separation of said connector board, along at least one of a longitudinal axis between said ends and a center axis extending between said first and second side portions of said connector board and perpendicular to the longitudinal axis, into at least two physically and electrically isolated connector board segments, at least one said segment for connecting a read element of said disk head to said test apparatus and at least one said segment for connecting a write element of said disk head to said test apparatus.

18. A connector board as recited in claim 17, wherein said board member is a material selected from a group consisting of laminate, polyimide or epoxy resin-bonded cellulose.

19. A connector board as recited in claim 17, wherein said board member further comprises a section having a plurality of portions defining a hole.

\* \* \* \* \*